United States Patent
Stowers et al.

(10) Patent No.: US 7,297,014 B1
(45) Date of Patent: Nov. 20, 2007

(54) SPRING LOCK INTERFACE ENGAGEMENT SYSTEM

(75) Inventors: Jeffery P. Stowers, Mt. Sidney, VA (US); Randall C. Garman, Grottoes, VA (US); Randall L. Herron, Waynesboro, VA (US); David L. Rocker, Charlottesville, VA (US)

(73) Assignee: Virginia Panel Corporation, Waynesboro, VA (US)

( * ) Notice: Subject to any disclaimer, the term of this patent is extended or adjusted under 35 U.S.C. 154(b) by 0 days.

(21) Appl. No.: 11/557,474

(22) Filed: Nov. 7, 2006

Related U.S. Application Data

(60) Provisional application No. 60/806,844, filed on Jul. 10, 2006.

(51) Int. Cl.
*H01R 13/62* (2006.01)
(52) U.S. Cl. ........................... 439/372; 439/953
(58) Field of Classification Search ............... 439/364, 439/372, 953
See application file for complete search history.

(56) References Cited

U.S. PATENT DOCUMENTS

| | | | |
|---|---|---|---|
| 3,166,369 A | 1/1965 | Trum | |
| 3,419,842 A | 12/1968 | Taylor | |
| 4,212,508 A | 7/1980 | Cline et al. | |
| 4,213,666 A | 7/1980 | Braginetz et al. | |
| 4,329,005 A | 5/1982 | Braginetz et al. | |
| 4,655,530 A | 4/1987 | Sheets et al. | |
| 5,037,321 A | 8/1991 | Uratsuji et al. | |
| 5,103,378 A | 4/1992 | Stowers et al. | |
| 5,227,718 A | 7/1993 | Stowers et al. | |
| 5,420,519 A | 5/1995 | Stowers et al. | |
| 5,562,458 A * | 10/1996 | Stora et al. | 439/348 |
| 5,576,631 A | 11/1996 | Stowers et al. | |
| 5,633,597 A | 5/1997 | Stowers et al. | |
| 5,820,401 A * | 10/1998 | Hasz et al. | 439/364 |
| 5,850,147 A | 12/1998 | Stowers et al. | |
| 5,936,421 A | 8/1999 | Stowers et al. | |
| 5,942,906 A | 8/1999 | Stowers et al. | |
| 5,966,023 A | 10/1999 | Burgers et al. | |
| 5,993,255 A * | 11/1999 | Yurko | 439/595 |
| 6,116,942 A * | 9/2000 | Chen et al. | 439/362 |
| 6,257,918 B1 * | 7/2001 | Yamamoto | 439/364 |
| 6,530,801 B2 * | 3/2003 | Bates et al. | 439/364 |
| 6,547,587 B2 | 4/2003 | Hurst et al. | |
| 6,781,391 B2 * | 8/2004 | Reed et al. | 324/754 |
| 6,824,405 B2 | 11/2004 | Hubbard et al. | |
| 6,869,321 B1 | 3/2005 | Ashby et al. | |
| 6,872,006 B2 | 3/2005 | Langouet et al. | |
| 6,882,138 B2 | 4/2005 | Langouet et al. | |
| 6,948,952 B2 | 9/2005 | Hubbard et al. | |
| 7,091,415 B2 | 8/2006 | Ashby et al. | |
| 2006/0205253 A1 | 9/2006 | Stowers et al. | |

\* cited by examiner

*Primary Examiner*—Thanh-Tam Le
(74) *Attorney, Agent, or Firm*—24IP Law Group; Timothy R. DeWitt

(57) ABSTRACT

An engagement system having a spring lock design to initially attach the two halves of the system together. After which the use of a multi start Acme lead screw provides a, consistent, low torque means of engagement. Although the engager requires the use of lubrication, to be applied initially, the lube is contained in a sealed environment. This eliminates the risk of contamination to electrical components and eliminates the need to apply additional lube during the products life. Because the present invention allows the ACME threads to be "meshed" at all times, it also eliminates the possibly of cross-threading.

16 Claims, 10 Drawing Sheets

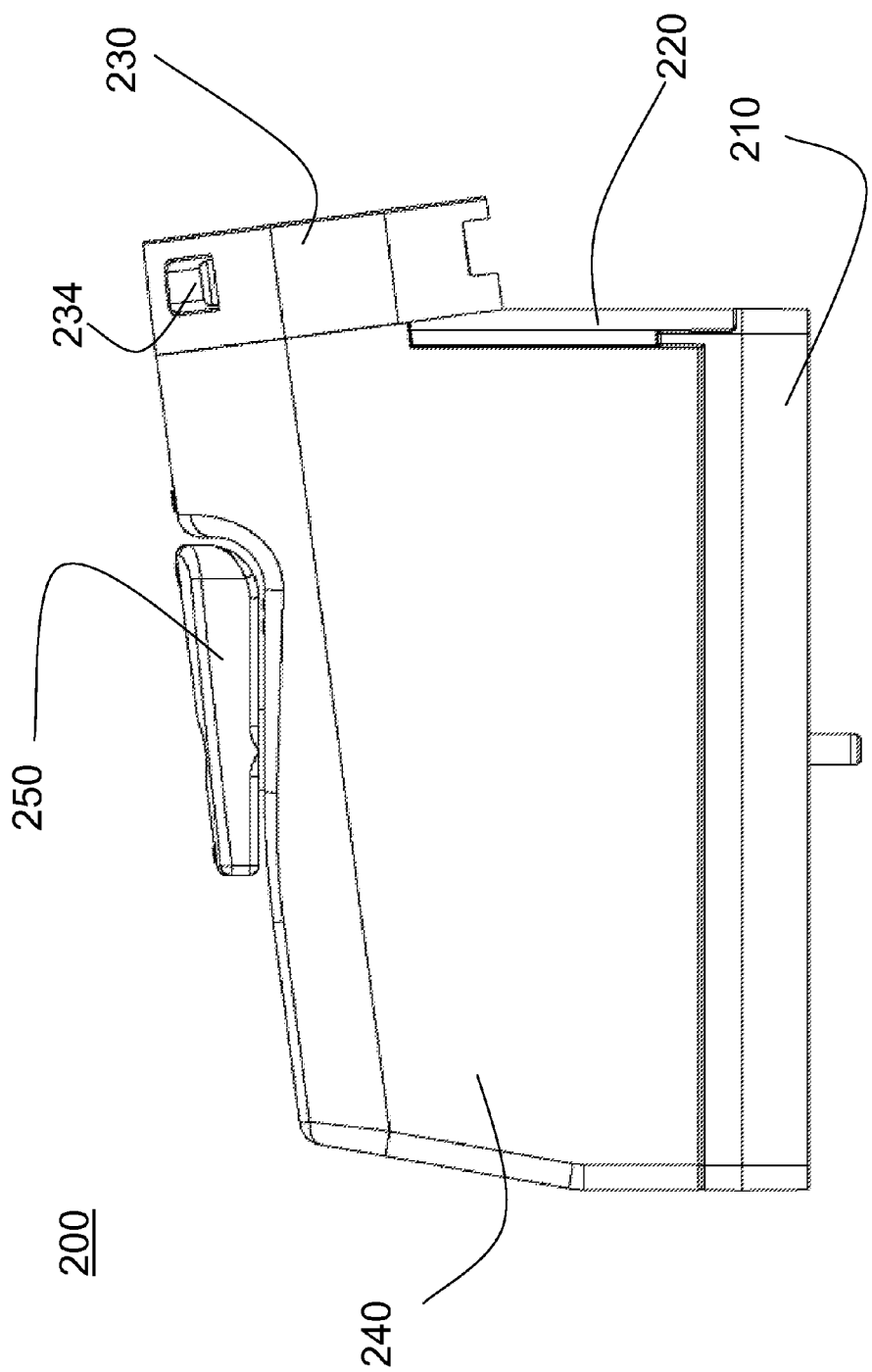

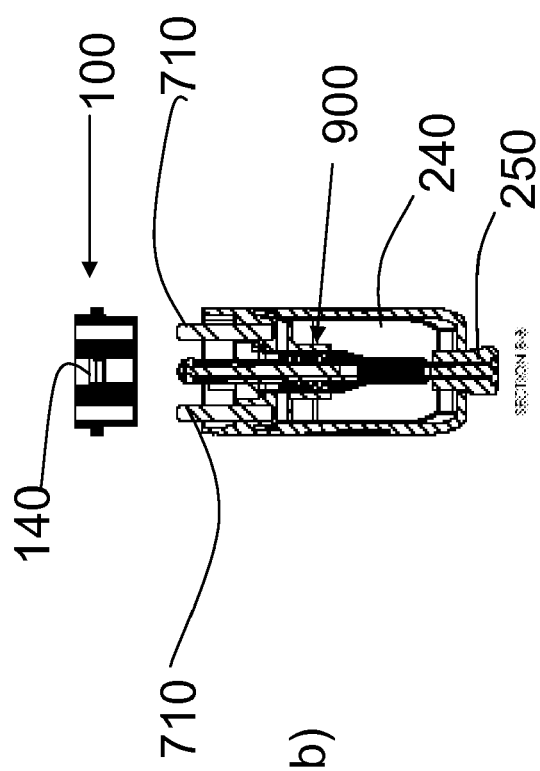
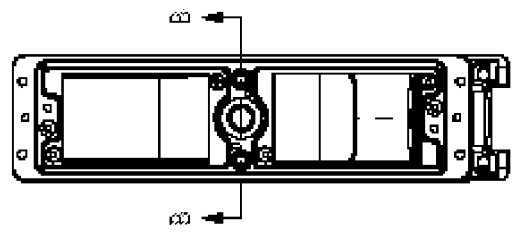
FIG. 8(b)
FIG. 8(a)

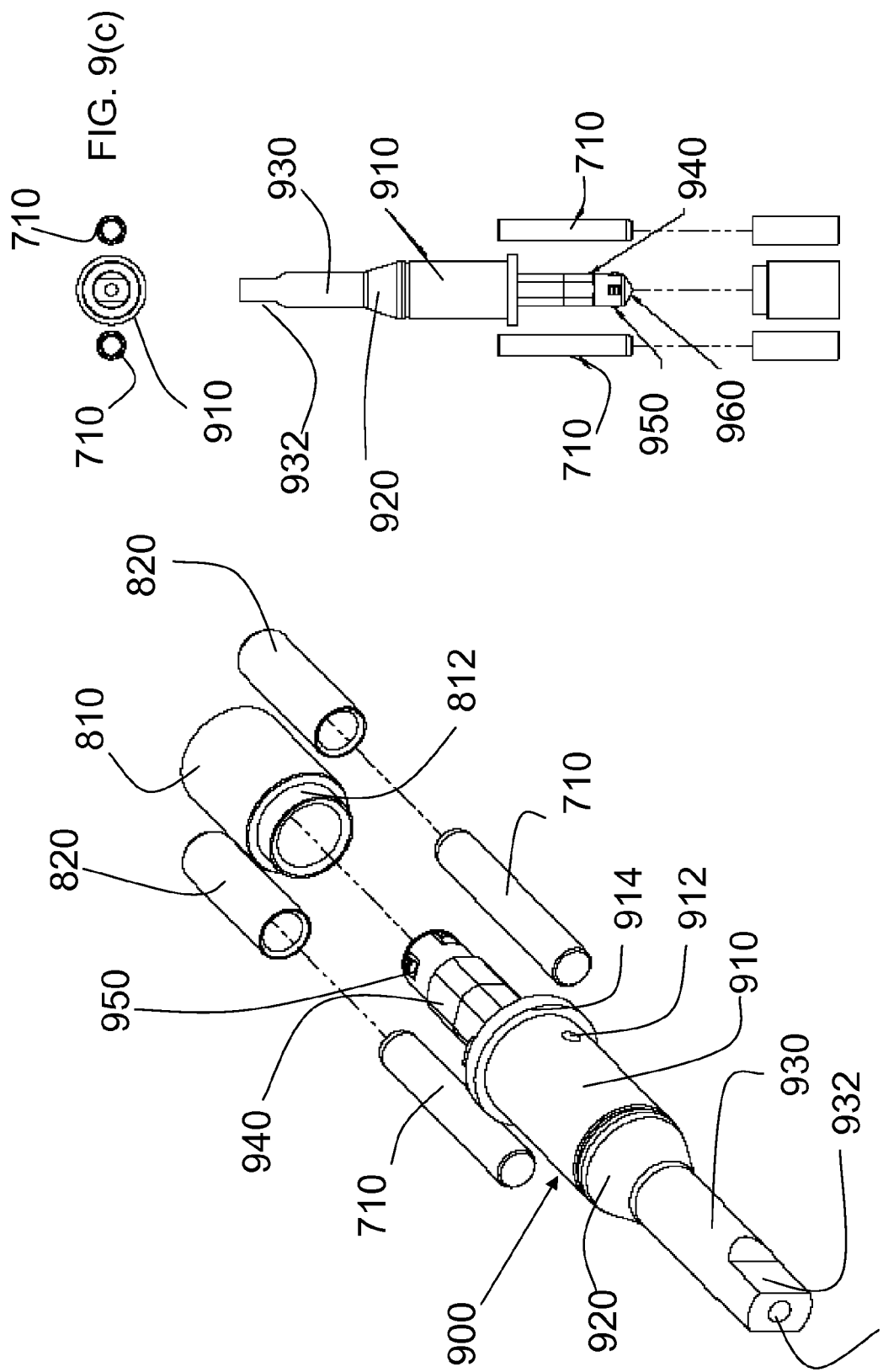

SPRING LOCK INTERFACE ENGAGEMENT SYSTEM

CROSS-REFERENCE TO RELATED APPLICATIONS

The present application claims the benefit of the filing date of U.S. Provisional Application Ser. No. 60/806,844 entitled "Spring Lock Interface Engagement System," and filed on Jul. 10, 2006.

The above cross-referenced related application is hereby incorporated by reference herein in its entirety.

STATEMENT REGARDING FEDERALLY SPONSORED RESEARCH OR DEVELOPMENT

None.

BACKGROUND OF THE INVENTION

1. Field of the Invention

The present invention relates to an apparatus for securing and locking interfaces of two items releasably together and more particularly to an apparatus for securing and locking together an array of electrical connectors in a common frame.

2. Brief Description of the Related Art

A variety of mass interconnect devices have been used in the past. One example of prior art interface systems was disclosed in U.S. Pat. No. 4,329,005, entitled "Slide Cam Mechanism for Positioning Test Adapter in Operative Relationship with a Receiver," which was assigned to Virginia Panel Corporation. In the '005 Patent, the receiver included an inner frame and outer walls. Between the outer walls and adjacent sides of the receiver frame were placed fixed hanger plates provided with straight slots and interior slides having coacting cam slots. The slides were driven by a hand lever and attached round torsion shaft with connected linkage having an over-dead-center locked position. Movement of the hand lever would cause the slides to move parallel to the outer walls and interior sides. Modules for holding various electrical contacts were mounted in the receiver parallel to the direction of movement of the slides.

The individual test adapter, or ITA, had four split roller dual bearings or rollers on common dry lube sleeves that would rotate oppositely during the camming action to minimize friction. The individual test adapter rollers rested on dwell shoulders of the cam slots and then descended through the straight slots during movement of the slides of the receiver to produce positive straight-on engagement of the test adapter and receiver multiple contacts. The slides had elongated linear guide bearings with dry lube pads for precision free movement. The slides were connected to a cylindrical torsion shaft via linkage. Like the receiver modules, the ITA modules were mounted in the system in a direction parallel to the ITA sides on which the rollers were located. When modules, pins, patchcords, and perhaps a cover are mounted to or on the interface test adapter, the assembly is sometimes referred to as a "fixture."

Another prior art system has been known as the MAC Panel Series 06, or rotating latch, interface device. In the rotating latch type device, the camming is performed by plates that rotate rather than moving in a linear fashion. In the rotating latch devices, the connector modules have been mounted to the receiver and test adapter frame parallel to the plant of rotation of the rotating latches.

Another prior art system sold by Virginia Panel Corporation included a receiver that included slides similar to those disclosed in the '005 patent but used pins at two corners, diagonal from one other, on the receiver. These pins inhibited vertical movement of the ITA in the receiver to produce straight-on engagement. This prior art system included machined side rails and a cylindrical torsion shaft.

Another prior interface device is known as the TTI Testron VG Series interface device. This device may be in a tabletop or a rack-mounted form. This VG Series device included a fixture support plate mounted to the receiver in a direction perpendicular to the face of the receiver. The receiver would be mounted directly to the test equipment.

The TTI Testron fixture, or test adapter, would be engaged to the receiver by lifting the fixture onto a pair of hooks protruding from the face of the receiver and then resting the fixture on the support plate. A handle and gears were used to pull the hooks, and hence, the fixture, into the receiver to cause the electrical contacts in the receiver and the fixture to mate.

Yet another prior art test system was used prior to 1980 in connection with the federal government's F-16 program. That system had a slide plate on each side of the receiver, with each slide plate connecting to the engagement pins on the sides of a corresponding ITA frame and each slide plate being pulled into the receiver via a connection near the center of the slide plate. This system suffered from significant problems of the ITA tilting to some degree and thereby causing contacts to be crushed.

Still other prior art engagement systems include those disclosed in U.S. Pat. No. 5,966,023. In still other prior art engagement systems, others have incorporated the use of a screw together engager that utilizes a range of thread styles including standard, Acme and high pitch helical grooves. The amount of rotation to engage these ranges from 180° to several full turns. One example of such a screw type engager is disclosed in U.S. Pat. No. 5,562,458 entitled "Interface Engagement and Locking System."

The systems that utilize standard threads or single start Acme threads typically require several turns to fully engage. Although they do not need lubrication, they have a tendency to cross-thread easily. The systems that employ helical grooves typically only require 180° of rotation to achieve full engagement but require a high amount of torque and the use of lubrication to maintain an only somewhat smooth feel during the process of engaging and disengaging. Even with the use of lubrication, these systems show a consistent pattern of extremely high wear on some of the components involved in the engagement procedure. The torque and the wear issues worsen over the cycle life of the system. Also, considering the geometry of these systems, the lubrication is required to be applied in an area that threatens sensitive electronic components.

SUMMARY OF THE INVENTION

The present invention incorporates a unique spring lock design to initially attach the two halves of the system together. After which the use of a multi start Acme lead screw provides a, consistent, low torque means of engagement. Although this engager requires the use of lubrication, to be applied initially, the lube is contained in a sealed environment. This eliminates the risk of contamination to electrical components and eliminates the need to apply additional lube during the products life. Because the present invention allows the ACME threads to be "meshed" at all times, it also eliminates the possibly of cross-threading.

In a preferred embodiment, the present invention is an interface device that comprises a test adapter having a frame, a plate mounted to the frame, a collar or bushing, a cover and an engagement mechanism. The engagement mechanism comprises a spring lock pin and a lead screw drive. The interface further comprises a receiver having a frame, and a channel for receiving the spring lock pin. The test adapter further may have an alignment pin and the receiver may further have a guide channel or other means for receiving the alignment pin.

In a preferred embodiment, the present invention is an interface device that comprises a test adapter having a frame and an engagement mechanism mounted to the frame. The engagement mechanism has a spring lock nut, a lead screw drive having a housing with interior threads that may be multi-start threads, an Acme lead screw in the housing, and a spring lock pin having at least one locking tab; and a handle connected to said spring lock nut. The interface device further comprises a receiver having a frame, a channel for receiving said spring lock pin; and means within said channel for engaging said at least one locking tab. The test adapter may further comprise an alignment pin and the receiver further may comprise a guide channel for receiving the alignment pin. The spring lock pin may comprise a body, at least one locking tab, and a blind alignment nose. The housing may provide a sealed environment for the lead screw drive. The test adapter may further comprise a cover attached to the frame, the cover having an opening therein, and a handle that comprises a body and a stem, wherein the body is located outside the cover and the stem extends through the opening in the cover and connects to the lead screw drive. The spring lock nut may, for example, have a pair of flat sides for connecting to the stem of the handle. The handle may be locked in a closed or open position.

In another preferred embodiment, the present invention is an interface that comprised a test adapter and a receiver. The test adapter has a frame and an engagement mechanism mounted to the frame. The engagement mechanism comprises a spring lock nut, a lead screw drive comprising a housing having interior threads, an Acme lead screw in the housing and having threads for engaging with the interior threads of the housing, and a spring lock pin having at least one locking tab, and a handle connected to the spring lock nut. The receiver comprises a frame, a channel for receiving the spring lock pin; and a ridge in the channel for engaging the at least one locking tab. In an alternative embodiment, there is a groove in the channel rather than or in addition to the ridge. During engagement of the test adapter with the receiver, the spring lock pin initially connects the test adapter to the receiver by the at least one locking tab engaging with the ridge in the channel and the lead screw drive draws the test adapter and the receiver together when the handle is turned. The test adapter may have a plurality of guide pins and the receiver may have a plurality of corresponding guide holes for receiving the guide pins.

In still another embodiment, the present invention is a test adapter having a frame and an engagement mechanism mounted to the frame. The engagement mechanism has a spring lock nut, a lead screw drive having a housing with interior threads that may be multi-start threads, an Acme lead screw in the housing, and a spring lock pin having at least one locking tab; and a handle connected to said spring lock nut.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

BRIEF DESCRIPTION OF THE DRAWINGS

For a more complete understanding of the present invention and the advantages thereof, reference is now made to the following description and the accompanying drawings, in which:

FIG. 3 is a side view of a test adapter in accordance with a preferred embodiment of the present invention.

FIG. 8(a) is a bottom view of a disengaged receiver and test adapter in accordance with a preferred embodiment of the present invention.

FIG. 8(b) is an end cross-section of a disengaged receiver and test adapter in accordance with a preferred embodiment of the present invention.

FIG. 9(a) is a perspective assembly drawing of a preferred embodiment of an engagement mechanism in accordance with a preferred embodiment of the present invention in a disengaged position.

FIG. 9(b) is a side assembly drawing of a preferred embodiment of an engagement mechanism in accordance with a preferred embodiment of the present invention in a disengaged position.

DETAILED DESCRIPTION OF THE PREFERRED EMBODIMENTS

Figure 1A:
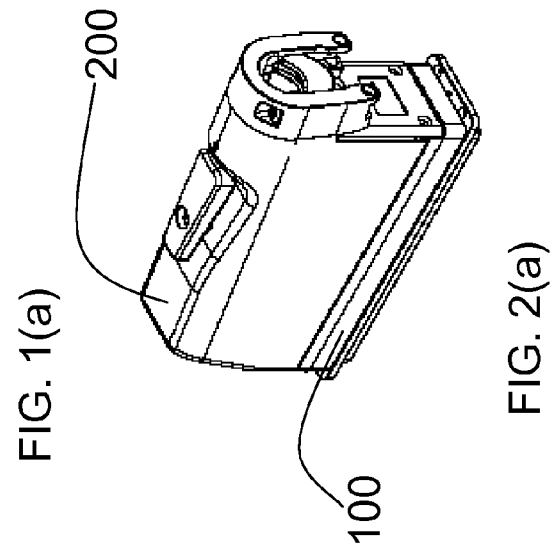
FIG. 1(a) is a perspective view of a receiver and test adapter of an engagement system in accordance with a preferred embodiment of the present invention in a disengaged position.
Figure 2A:
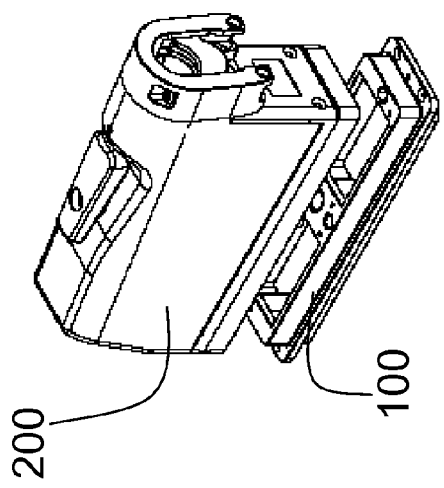
FIG. 2(a) is a perspective view of a receiver and test adapter of an engagement system in accordance with a preferred embodiment of the present invention in an engaged position.
Figure 1B:
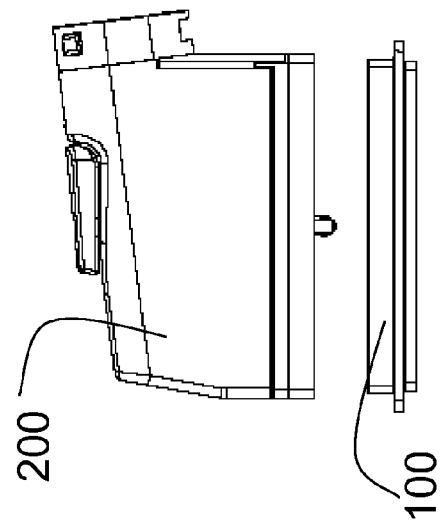
FIG. 1(b) is a side view of a receiver and test adapter for an engagement system in accordance with a preferred embodiment of the present invention in a disengaged position.
Figure 2B:
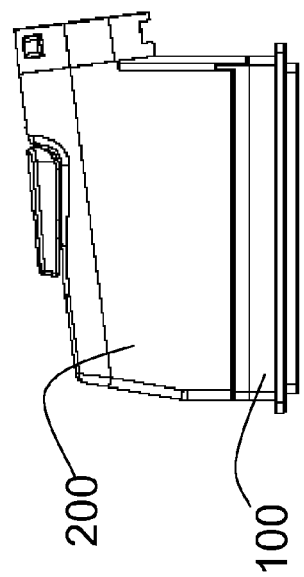
FIG. 2(b) is a side view of a receiver and test adapter of an engagement system in accordance with a preferred embodiment of the present invention in an engaged position.
Figure 4:
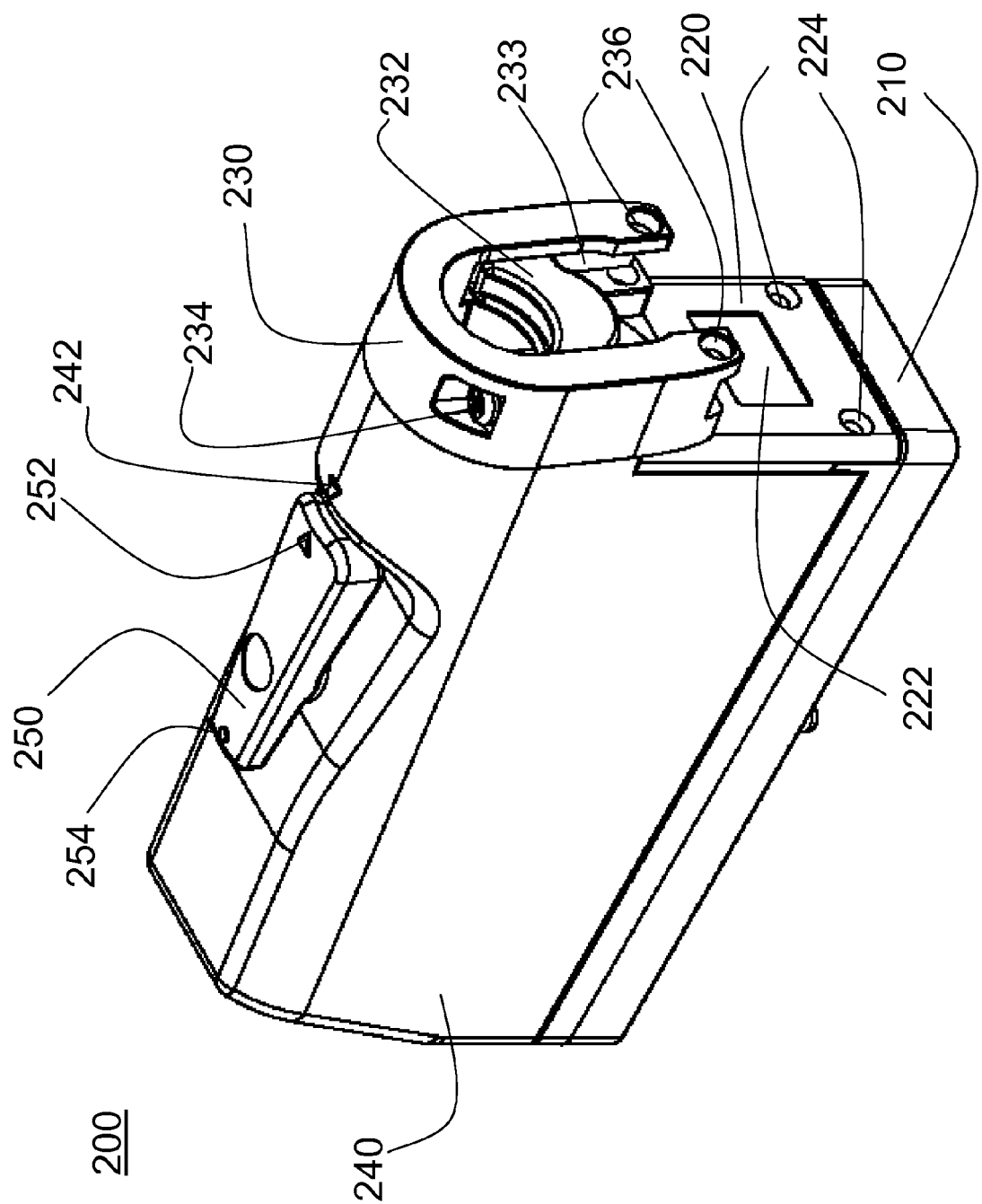
FIG. 4 is a perspective view of a test adapter in accordance with a preferred embodiment of the present invention.
Figure 5:
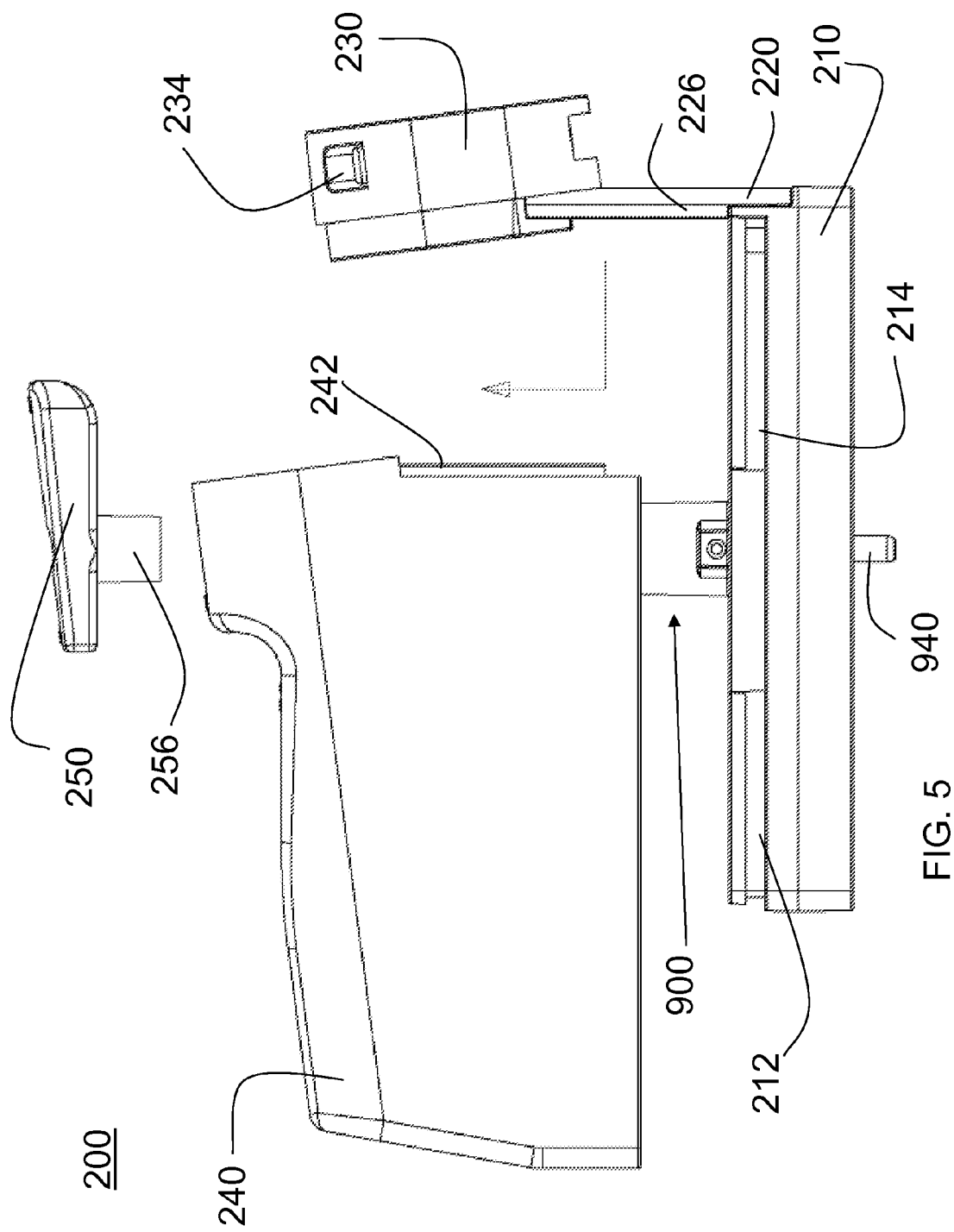
FIG. 5 is a side view of a test adapter in accordance with a preferred embodiment of the present invention with its cover removed.
Figure 6:
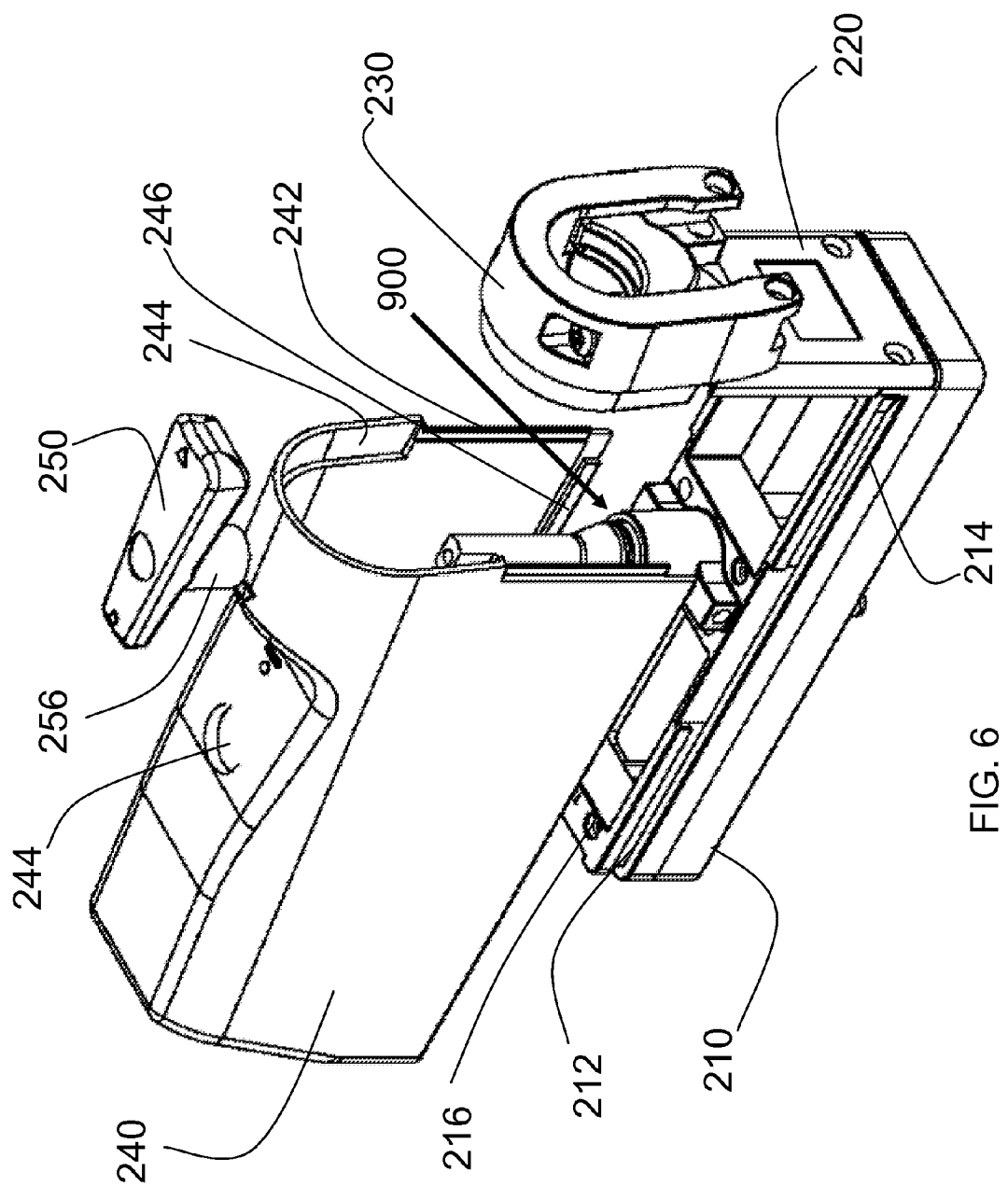
FIG. 6 is a perspective view of a test adapter in accordance with a preferred embodiment of the present invention with its cover removed.
Figures 7A, 7B:
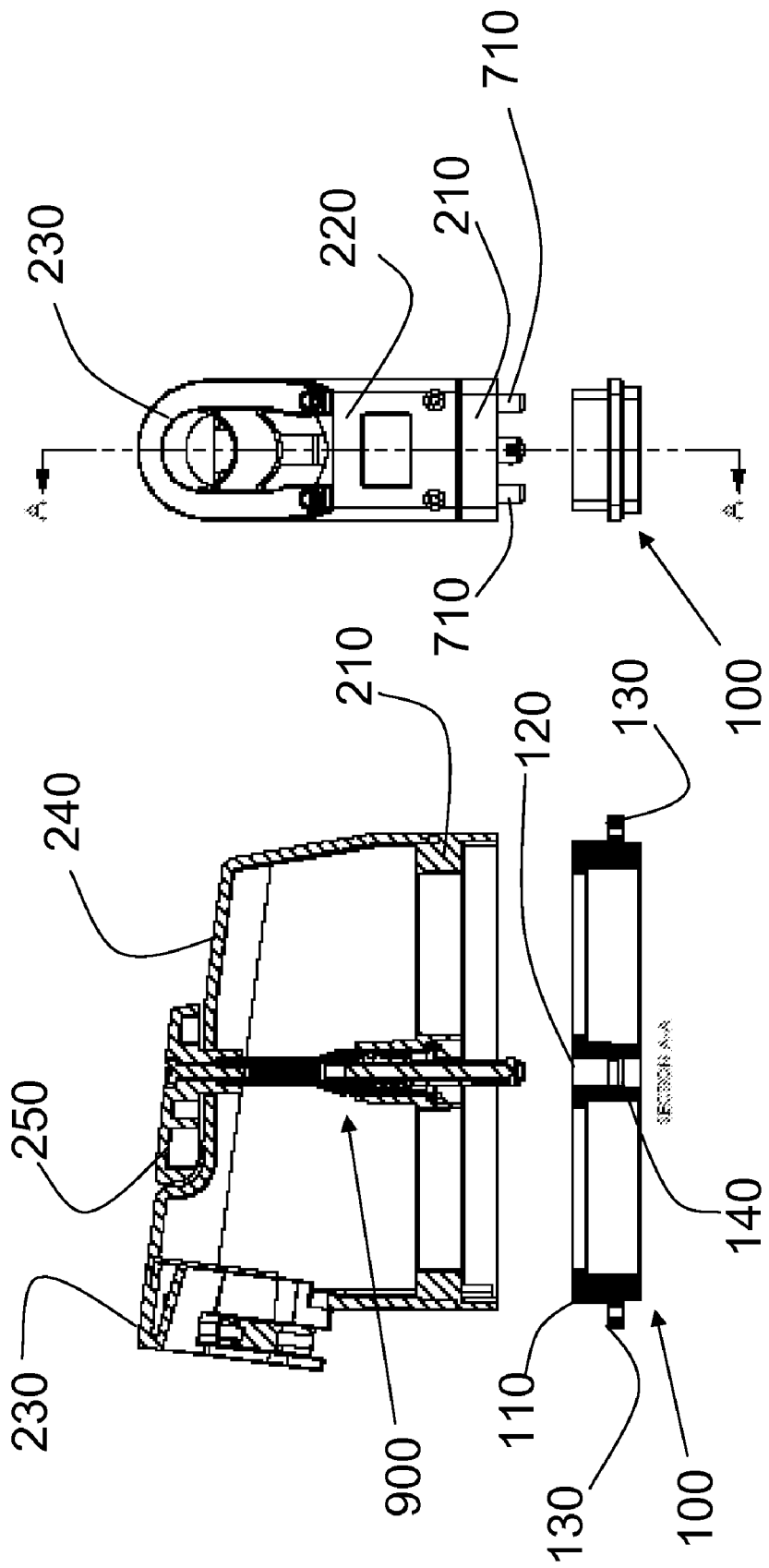
FIG. 7(a) is an end view of a disengaged receiver and test adapter in accordance with a preferred embodiment of the present invention.
FIG. 7(b) is a side cross-section of a disengaged receiver and test adapter in accordance with a preferred embodiment of the present invention.

A preferred embodiment of the present invention is described with reference to FIGS. 1-10. An engagement system in accordance with the present invention has a receiver 100 and a test adapter 200. The receiver 100 has a frame 110 having mounting members 130 on each end and an opening 120 in which there is a spring lock bushing 140. The test adapter 200, shown in FIGS. 3-6, has a frame 210, a plate 220, a collar 230, a cover 240 and a handle 250.

In a preferred embodiment, the frame 210 is in the shape of a rectangle having two pairs of opposing sides. On the each of the pair of long sides is a pair of grooves 212, 214 for use in releasably attaching the cover 240 to the frame 210 via tongue 246. The frame further may have means such as holes 216 for mounting modules or connectors to the frame. The frame additionally has alignment pin bushings 820 for receiving a pair of guide pins 710 and a spring lock bushing 810 for receiving a spring lock pin 940 of an engagement mechanism 900.

The plate 220 has a pair of holes 224 through which, for example, screws (not shown) may be placed to secure the plate 220 to one of the short sides of the frame 210. While screws are used in a preferred embodiment, any means for attaching may be used to attached the plate 220 to the frame 210. The plate 220 may have additional features such as a recess 222 for placement of a label.

The collar 230 is attached to the plate 220 via, for example, screws (not shown) through holes 236. The collar 230 has a clamp 232 that slides within a pair of grooves 233, one on each of two sides of the collar 230. When in use, patchcords go through the collar to pins mounted in the test adapter frame 210. The clamp 232 may be tightened around the patch cords (not shown) via, for example, a screw 234.

The cover 240 has two open faces, one opposing the frame 210 and one opposing the plate 220 when the cover is attached to the frame 210 and plate 220. The edge on each of the two parallel sides of the open face of the cover opposing the test adapter frame 110 has a tongue or tongues to mate with the grooves 212, 214 in the frame 110. The two parallel sides of the open face of the cover opposing the plate 220 has a lip 242 for placement within a lip 226 of the plate 220 when the cover is placed onto the frame 210 and plate 220. The cover further has a hole 244 through a stem 256 of a handle 250 extends to attach to an engagement mechanism 900.

The handle 250 may have on it markings 252, 254 for indicating whether the engagement mechanism is in an open or closed position. The cover likewise may have a marking 242 or markings to assist in indicate the open or closed position of the handle 250.

Figure 10B:
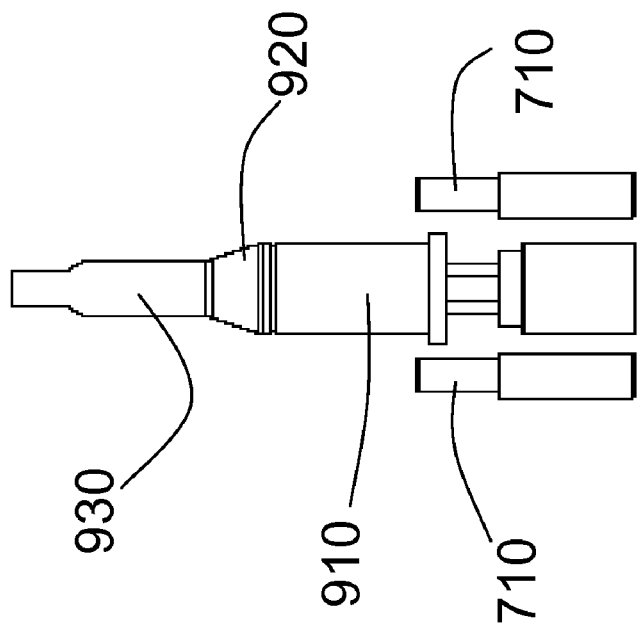
FIG. 10(b) is a side assembly drawing of a preferred embodiment of an engagement mechanism in accordance with a preferred embodiment of the present invention in an engaged position.
Figure 10A:
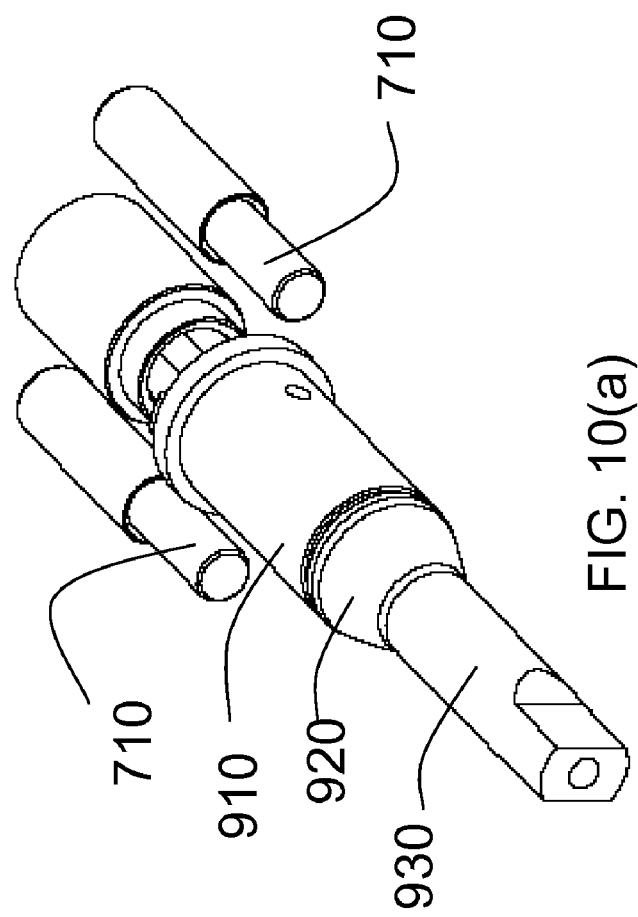
FIG. 10(a) is a perspective assembly drawing of a preferred embodiment of an engagement mechanism in accordance with a preferred embodiment of the present invention in an engaged position.

The locking mechanism 900 is shown in more detail in FIGS. 9(a)-(b) in a disengaged position and in FIGS. 10(a)-(b) in an engaged position. The locking mechanism 900 has a ring 920, a lead screw drive 910 and a spring lock nut 930. The spring lock nut 930 has two opposing flats 932 that are used to transfer torque from the engagement handle 250 to the spring lock nut 930, a threaded hole 934 for a shoulder screw (not shown) that attaches the engagement handle 250 to the spring lock nut 930, and a shoulder 914 that positions the engagement mechanism 900 within the ITA housing. There is a groove between ring 920 and lead screw drive 910 that is for a retaining ring (not shown) that positions the engagement mechanism 900 in the ITA Housing. Further, there are two ball plungers (not shown) that align with feature 912 to hold the handle 250 in the open position. The locking mechanism 900 further has a spring lock pin 940 and locking tabs 950. In the preferred embodiment shown in the figures, four locking tabs 950 are shown, but a different number of locking tabs, such as one, two, three, or more locking tabs may be used. The locking tabs 950 are used to initially attach the test adapter 200 to the receiver 100 by placement of the spring lock pin 940 with a blind mate alignment rose 960 into the receiving means 810 in the receiver. When so placed, the locking tabs 950 latch into means, such as a groove or ridge 140, within the receiving means 810 in the receiver.

Figures 11A, 11B:
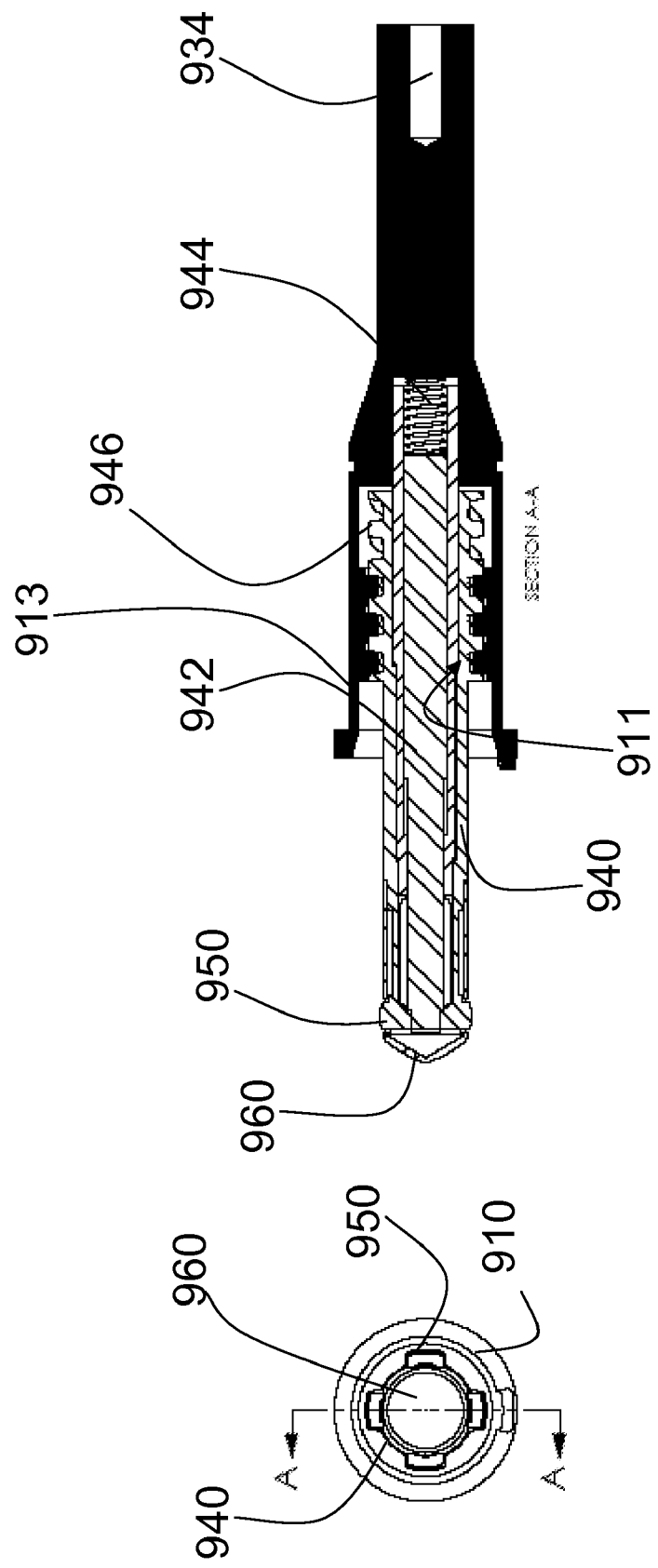
FIG. 11(a) is an end view of a lead screw drive of a preferred embodiment of the invention.
FIG. 11(b) is a cross-section of a lead screw drive of a preferred embodiment of the present invention.

After that initial attachment of the test adapter 200 to the receiver 100, a multi start Acme lead screw 946 within the lead screw drive 910 provides a, consistent, low torque means of engagement to draw the test adapter 200 into the receiver 100 and complete the connections between contact pins in the receiver and in the test adapter. As shown in FIGS. 11(a) and (b), the lead screw drive 910 has a spring lock pin 940 having a pin 942 and a spring 944 and an Acme lead screw 946. The Acme lead screw threads engage with threads 911 on the interior of the lead screw drive housing 913.

The pin 942 is spring loaded and positions itself in the beginning of the lead screw operation to prevent the locking tabs from retracting. As the lead screw continues to the full engaged position the pin 942 travels with the locking tabs 950. In the disengaged position the locking tabs 950 travel with the pin 942 until the end of the stroke, allowing the tabs 950 to be able to retract when the device is pulled away from the receiver frame, do to the back angle slope on the locking tabs.

Although this engager requires the use of lubrication, to be applied initially, the lube is contained in a sealed environment in the lead screw drive 910. This eliminates the risk of contamination to electrical components and eliminates the need to apply additional lube during the products life. Because the present invention allows the ACME threads to be "meshed" at all times, it also eliminates the possibly of cross-threading.

The foregoing description of the preferred embodiment of the invention has been present for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. An interface device comprising:
   a test adapter comprising:
      a frame; and
      an engagement mechanism mounted to said frame, said engagement mechanism comprising:
         a spring lock nut;
         a lead screw drive comprising a housing having interior threads, an Acme lead screw in said housing, and a spring lock pin having at least one retractable locking tab; and
         a handle connected to said spring lock nut; and
   a receiver comprising:
      a frame;
      a channel for receiving said spring lock pin; and
      means within said channel for engaging said at least one locking tab.

2. An interface device according to claim 1 wherein said test adapter further comprises an alignment pin and said receiver further comprising a guide channel for receiving said alignment pin.

3. An interface device according to claim 1 wherein said spring lock pin comprises a body, said at least one locking tab, and a blind alignment nose.

4. An interface device according to claim 1 wherein said housing provides a sealed environment for said lead screw drive.

5. An interface device according to claim 1 wherein said at least one locking tab comprises four locking tabs.

6. An interface device according to claim 1, wherein
   said test adapter further comprises a cover attached to said frame, said cover having an opening therein; and
   said handle comprises a body and a stem, wherein said body is located outside said cover and said stem extends through said opening in said cover and connects to said lead screw drive.

7. An interface device according to claim 1, wherein said test adapter further comprises a plate connected to said frame and a collar connected to said plate.

8. An interface device according to claim 7 wherein said collar comprises a clamp for clamping wires.

9. An interface device according to claim 6 wherein said spring lock nut has a pair of flat sides for connecting to said stem of said handle.

10. An interface device according to claim 9 wherein said spring lock nut further comprises means for connecting said handle to said spring lock nut.

11. An interface device according to claim 1 further comprising means for locking said handle in a closed position.

12. An interface device according to claim 1 further comprising means for locking said handle in an open position.

13. An interface device according to claim 1 wherein said threads on said Acme screw comprise multi-start threads.

14. An interface comprising:
    a test adapter comprising:
       a frame; and
       an engagement mechanism mounted to said frame, said engagement mechanism comprising:
          a spring lock nut;
          a lead screw drive comprising a housing having interior threads, an Acme lead screw in said housing and having threads for engaging with said interior threads of said housing, and a spring lock pin having at least one locking tab; and
          a handle connected to said spring lock nut; and
    a receiver comprising:
       a frame;
       a channel for receiving said spring lock pin; and
       a ridge in said channel for engaging said at least one locking tab;
    wherein during engagement of said test adapter with said receiver, said spring lock pin initially connects said test adapter to said receiver by said at least one locking tab engaging with said ridge in said channel and said lead screw drive draws said test adapter and said receiver together when said handle is turned.

15. An interface according to claim 14 wherein said test adapter comprises a plurality of guide pins and said receive further comprises a plurality of guide holes for receiving said guide pins.

16. An interface device comprising:
    a test adapter comprising:
       a frame; and
       an engagement mechanism mounted to said frame, said engagement mechanism comprising:
          a spring lock nut;
          a lead screw drive comprising a housing having interior threads, an Acme lead screw in said housing and having threads for engaging with said interior threads of said housing, and a spring lock pin having at least one locking tab; and
          a handle connected to said spring lock nut; and
    a receiver comprising:
       a frame;
       a channel for receiving said spring lock pin; and
       a groove in said channel for engaging said at least one locking tab;
    wherein during engagement of said test adapter with said receiver, said spring lock pin initially connects said test adapter to said receiver by said at least one locking tab engaging with said groove in said channel and said lead screw drive draw said test adapter and said receiver together when said handle is turned.

* * * * *